United States Patent [19]

Sniderman

[11] Patent Number: 4,763,941
[45] Date of Patent: Aug. 16, 1988

[54] AUTOMATIC VACUUM GRIPPER
[75] Inventor: Albert Sniderman, Wayne, Pa.
[73] Assignee: Unisys Corporation, Blue Bell, Pa.
[21] Appl. No.: 60,210
[22] Filed: Jun. 11, 1987
[51] Int. Cl.$^4$ ............................ B66C 1/02; B65H 3/08
[52] U.S. Cl. .................................... 294/64.1; 414/627;
414/752; 271/103
[58] Field of Search .................... 294/64.1, 64.2, 64.3,
294/65; 414/627, 737, 744 B, 752; 269/21;
271/90, 91, 103; 279/3; 248/362, 363; 29/743

[56] References Cited

U.S. PATENT DOCUMENTS 4,189,137 2/1980 Denney et al. .................... 294/64.1

FOREIGN PATENT DOCUMENTS 150256 2/1953 Australia ............................ 294/64.1

Primary Examiner—James B. Marbert
Attorney, Agent, or Firm—Albert B. Cooper; Laurence J. Marhoefer

[57] ABSTRACT

The automatic vacuum gripper comprises a gripper member with a resilient seal coupled to a hollow piston and shaft. The piston is spring loaded downward in a cylinder coupled to a vacuum source. With vacuum applied, the piston does not move until the gripped part is completely sealed to the gripper member.

4 Claims, 1 Drawing Sheet

AUTOMATIC VACUUM GRIPPER

BACKGROUND OF THE INVENTION

1. Field of the Invention

The invention relates to automated assembly equipment particularly with respect to the vacuum grippers utilized therein for picking up components.

2. Description of the Prior Art

Vacuum grippers are utilized in present day automated assembly equipment for picking up component parts and moving the parts, for example, horizontally from one location to another. For example in automated equipment for assembling printed circuit boards, leaded components may be fed down a chute into a presentation site wherefrom they are removed by a vacuum gripper to a different location in the assembly equipment. The conventional vacuum gripper comprises a member connected to a vacuum source through a valve. The gripper is moved vertically to contact the device to be lifted and is opened to vacuum to grip the device. Equipment is included to then lift the gripper with the device secured thereto so that the pins of the component clear the walls of the presentation site. The gripper with the part affixed thereto may then be transported horizontally to another location. If the component part is not securely held on the gripper by the vacuum, the part may be dislodged when the gripper is accelerated horizontally during the transport portion of the operation. Expensive components such as pin grid arrays may be damaged if this occurs. Thus prior art vacuum grippers have a safety disadvantage because misalignment of the device with respect to the gripper or superfluous substances such as dirt or the like may prevent an adequate seal between the gripper and the part resulting in dislodgement and damage.

Prior art vacuum grippers may utilize an expensive pressure sensor that monitors the vacuum within the gripper to determine when to perform the lifting operation. When the vacuum is high enough the pressure sensor provides a signal to the motion device to lift the gripper since high vacuum within the gripper indicates a securely held part. The lifting device associated with the gripper may comprise expensive controls and secondary valving to effect the lifting operation.

Alternatively, the prior art may utilize a timer to determine when to lift the gripper. A predetermined time interval is required to exhaust the gripper and tubulation so that the component part to be picked up will be securely fastened on the gripper. The timer utilized in the prior art actuates the vertical motion device after the predetermined time interval has elapsed. Although the timer alternative is less expensive then the pressure sensor it may not be as safe since the gripper could be lifted and transported horizontally with an inadequately gripped component part.

It is appreciated, therefore, that the prior art required a motion device to lower the gripper toward the part to be picked up, an additional motion device to raise the gripper after the part had been secured and yet still further motion devices to effect translation from one location to another. In a pneumatically operated system, the motion device to raise the gripper from the presentation site requires secondary control and valving as well as sensors or timers to assure that the gripper is retracted only when the component part is secured thereto.

SUMMARY OF THE INVENTION

The automatic vacuum gripper of the present invention comprises a cylinder that may be ported to vacuum. A piston slidably disposed in the cylinder is coupled to a gripper through a shaft. A vacuum passage through the gripper, shaft, and piston couples the gripping surface of the gripper to the interior of the cylinder. A spring urges the piston in a direction opposite to the direction in which the vacuum tends to move the piston.

DESCRIPTION OF THE PREFERRED EMBODIMENT

Figure 1:
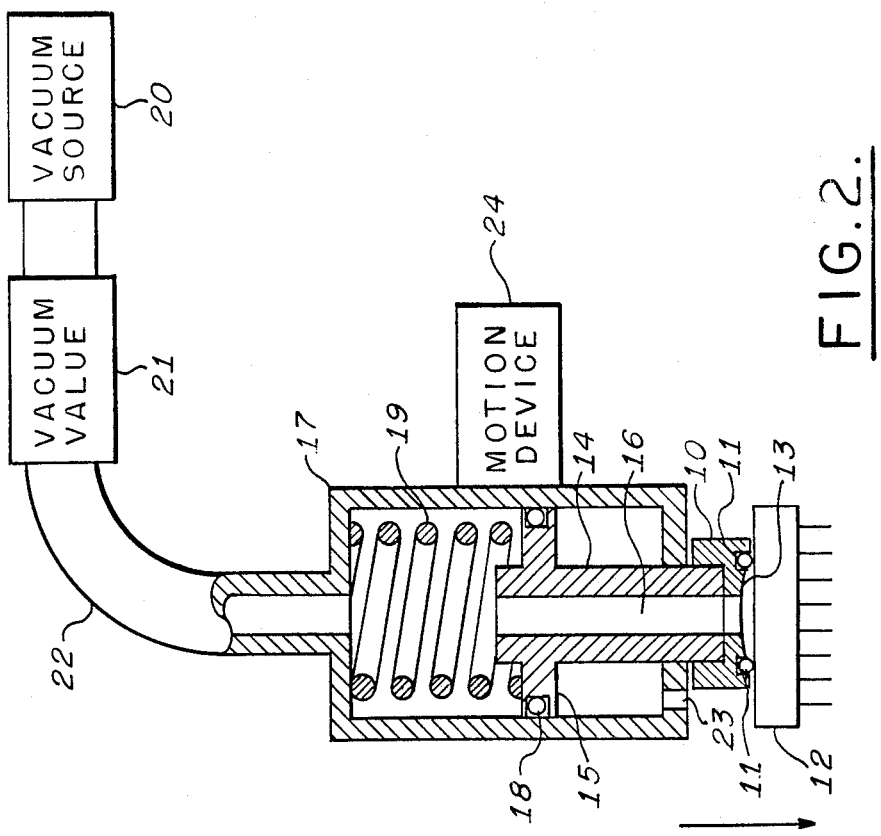
FIG. 1 is an elevation view in section of the automatic vacuum gripper of the present invention in an extended position.

Referring to FIG. 1, a cross section view depicting the elements of the automatic vacuum gripper of the present invention is illustrated. The automatic vacuum gripper includes a gripper member 10 with a resilient seal 11 for contacting and picking up a component part such as a part 12 as illustrated. The resilient seal 11 defines an operative gripping cavity 13 for effectively gripping the part 12. The resilient seal 11 may comprise an O-ring. The gripper 10 is affixed to a rod 14 at the top of which a piston 15 is disposed. A vacuum passage 16 traverses the longitudinal axis of the piston 15, the rod 14, and the gripper 10 terminating at an opening at the gripping cavity 13.

The piston 15 is disposed to slide in a cylinder 17 and a seal 18 is disposed at the circumference of the piston 15 to form a slidable vacuum seal with the inner wall of the cylinder 17. The piston is spring loaded in the direction of the arrow by a return spring 19 disposed within the cylinder 17. The interior of the cylinder 17 is coupled to a vacuum source 20 through a vacuum valve 21 and suitable tubulation 22. Thus, when the cylinder 17 is opened to the vacuum source 20 through the vacuum valve 21, vacuum is applied through the vacuum passage 16 to the gripping cavity 13. The bottom of the cylinder 17 is open to atmospheric pressure through an aperture 23. A motion device 24 is schematically illustrated for moving the entire automatic vacuum gripper assembly in the direction of the arrow.

In use, the cylinder 17 is opened to the vacuum source 20 via the vacuum valve 21 and the entire automatic vacuum gripper is moved in the direction of the arrow by the motion device 24 toward the component part 12 to be lifted. Prior to the seal 11 contacting the component part 12, vacuum does not build up in the cylinder 17 because the vacuum passage 16 is open to the atmosphere. When the seal 11 of the gripper 10 contacts the component part 12, the vacuum passage 16 is sealed. Vacuum builds up in the cylinder 17 and atmospheric pressure through the aperture 23 bears against the bottom of the piston 15 overcoming the force of the spring 19. The piston 15, and therefore, the component part 12, held securely on the gripper 10 by the vacuum, are lifted in a direction opposite to the arrow.

Figure 2:
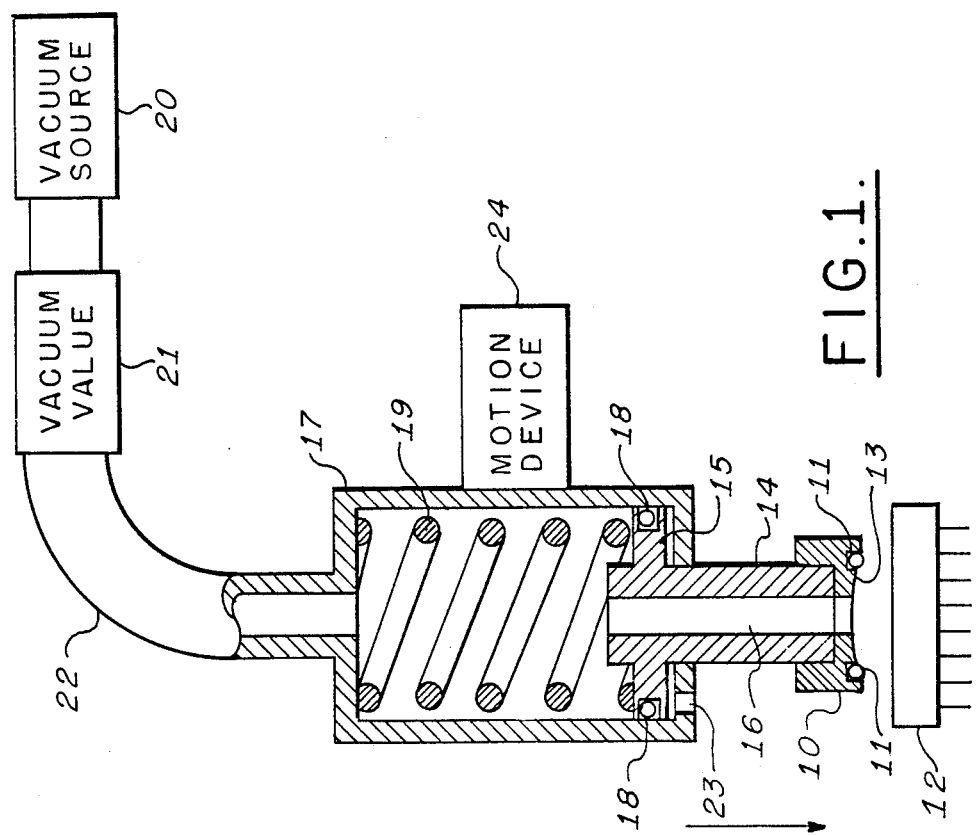
FIG. 2 is an elevation view in section of the automatic vacuum gripper of the present invention in a retracted position.

Referring to FIG. 2, in which like reference numerals indicated like components with respect to FIG. 1, the automatic vacuum gripper is illustrated in its fully lifted position. Thereafter a motion device (not shown) moves the assembly to another location.

It is appreciated that opening the vacuum gripper to vacuum automatically performs three functions that were individually performed in the prior art. The vacuum clamps the component part to be picked up to the gripper, provides the lifting operation and monitors that the component part is firmly gripped. It is only when the component part is firmly sealed to the gripper 10 that the vacuum can build up to the level where the piston 15 retracts. If the component part is not securely clamped, there will be sufficient leakage of air into the gripper that the piston 15 will not move. Thus, operative lifting can only occur when the component part is firmly clamped on the gripper 10.

Normally, a micro switch (not shown) would be included to verify that the piston 15 had lifted to its retracted position shown in FIG. 2.

In summary, the automatic vacuum gripper of the present invention has two primary advantages. Firstly, the automatic vacuum gripper is less complex than the prior art devices since sensors and timers are not required to determine that the vacuum has built up since the piston only moves when the device to be lifted is secure. The present invention, therefore, utilizes fewer parts than the prior art devices. Additionally, secondary controls and valving are not required to effect the lifting operation. Secondly, the automatic vacuum gripper of the present invention is safer than the prior art devices since the piston only effects lifting when there is a component part firmly affixed to the gripper.

While the invention has been described in its preferred embodiments it is to be understood that the words which have been used are words of description rather than limitation and that changes may be made within the purview of the appended claims without departing from the true scope and spirit of the invention in its broader aspects.

I claim:

1. A vacuum gripper for gripping a part to be lifted comprising
   a cylinder having a coupling adapted to be coupled to a source of vacuum,
   a piston slidably disposed in said cylinder,
   said cylinder having an opening to atmosphere on the side of said piston opposite said coupling,
   a spring urging said piston in a predetermined direction to a predetermined maximum distance position, and
   a gripper member coupled through a shaft to said piston, said grippper member having a gripping cavity,
   said gripper member, said shaft and said piston having a passage therethrough coupling said cylinder to said gripping cavity for transmission of vacuum thereto,
   said vacuum being transmitted from said coupling to said gripping cavity when said piston is and is not at said maximum distance position,
   so that when said cylinder is coupled to said source of vacuum and said part is sealing said cavity said piston is moved within said cylinder by atmospheric pressure in a direction opposite said predetermined direction against said spring.

2. The vacuum gripper of claim 1 wherein said cavity is defined by a vacuum seal.

3. The vacuum gripper of claim 2 further including a vacuum valve coupling said source of vacuum to said cylinder for applying vacuum to said cylinder so that said part to be gripped in contact with said vacuum seal is affixed to said gripper member and said piston is moved in said direction opposite said predetermined direction.

4. The vacuum gripper of claim 1 further including motion device means coupled to said cylinder for moving said cylinder in said predetermined direction.

* * * * *